United States Patent [19]

Bassous et al.

[11] Patent Number: 5,357,899
[45] Date of Patent: Oct. 25, 1994

[54] EPITAXIAL SILICON MEMBRANES

[75] Inventors: Ernest Bassous, Bronx; Bernard S. Meyerson, Yorktown Heights, both of N.Y.; Kevin J. Uram, Livermore, Calif.

[73] Assignee: International Business Machines Corporation, Armonk, N.Y.

[21] Appl. No.: 120,290

[22] Filed: Sep. 13, 1993

Related U.S. Application Data

[62] Division of Ser. No. 774,010, Oct. 8, 1991, Pat. No. 5,273,829.

[51] Int. Cl.$^5$ .................................................. C30B 1/08
[52] U.S. Cl. ................................................ 117/4; 117/9
[58] Field of Search ....... 156/603, DIG. 64, DIG. 67, 156/DIG. 86, DIG. 113; 428/446, 472; 430/5

[56] References Cited

U.S. PATENT DOCUMENTS 5,259,918  11/1993  Akbar et al. .................... 156/610
5,286,334   2/1994  Akbar et al. .................... 156/603

*Primary Examiner*—R. Bruce Breneman
*Assistant Examiner*—Felisa Garrett
*Attorney, Agent, or Firm*—Heslin & Rothenberg

[57] ABSTRACT

The subject invention provides a silicon membrane material made from silicon that is epitaxially deposited at low temperatures greater than or equal to 500° C. and doped with controlled amounts of boron and germanium. A silicon membrane structure is provided and made by one or more layers of ultra thin epitaxially deposited silicon layers that are precisely controlled in both thickness and composition. At least one of the layers is doped with boron in a concentration range greater than $2 \times 10^{20}$ atoms of boron per cubic centimeter of silicon, or with germanium in a concentration range greater than $5 \times 10^{20}$ atoms of germanium per cubic centimeter of silicon, or with a combination of boron and germanium in these concentration ranges. A silicon membrane fabrication process is also provided which requires no additional masking film to protect the membrane surface during KOH etching of the bulk silicon substrate.

5 Claims, 1 Drawing Sheet

EPITAXIAL SILICON MEMBRANES

This application is a division of application Ser. No. 07/774,010, filed Oct. 8, 1991, now allowed, U.S. Pat. No. 5,273,829.

TECHNICAL FIELD

This invention relates to silicon membranes, and more particularly to silicon membranes suitable for use in x-ray lithography and micromechanical devices, such as sensors, transducers, and actuators. The silicon membrane is formed by epitaxial chemical vapor deposition at or above 500° C. of silicon doped with boron and/or germanium at high concentration levels.

BACKGROUND ART

X-ray lithography is a technology which is competing with photolithography in the manufacture of semiconductor devices. X-ray lithography enables the formation of minute patterns on the order of sub-micron levels by utilizing rays of a shorter wavelength than the ultra violet rays which are used in photolithography. These rays of a shorter wavelength, x-rays, are subject to less diffraction and therefore can be used to produce much finer features on semiconductor devices. The ability to produce much finer features using x-rays allows the creation of denser circuitry than was previously possible with photolithography. A description of fundamental x-ray lithography techniques is given in U.S. Pat. No. 3,743,842, the contents of which are hereby incorporated by reference.

In furthering the x-ray lithography technology, suitable membranes for the fabrication of x-ray masks are required. These membranes are a critical element in applying x-ray lithography.

U.S. Pat. No. 4,866,746 discloses an x-ray mask membrane material made of boron nitride and silicon nitride in a composition range which results in optimum hardness and toughness.

U.S. Pat. No. 4,152,601 discloses a membrane material consisting of multiple layers of silicon nitride and silicon oxide.

U.S. Pat. No. 4,804,600 discloses an x-ray lithography mask made on an organic plastic film and then transferred and bonded to a support. The support has a groove which facilitates the flow of adhesive and the patent is directed to the transfer process and the advantages of the groove.

U.S. Pat. No. 4,940,841 discloses a membrane for use in an x-ray mask which comprises boron, silicon and nitrogen in a preferred composition range and made under specific preparation conditions.

U.S. Pat. No. 4,647,517 discloses a mask for x-ray lithography which uses epitaxially grown membranes of silicon doped with boron and germanium. The epitaxial membrane film is grown by conventional methods, i.e. at high temperature (at or above 1,000° C.), and on one side of the wafer only. The process is limited in the range of boron and germanium concentrations, allowing concentrations of boron up to only $2 \times 10^{20}$ atoms/cm$^3$ (approximately 1 atom of boron per 250 atoms of silicon) and of germanium up to only $5 \times 10^{20}$ atoms/cm$^3$ (approximately 1 atom of germanium per 100 atoms of silicon).

None of these references discloses a membrane material suitable for x-ray lithography comprising silicon doped with boron and/or germanium in high concentrations and prepared at low temperature. Such high dopant concentrations and preparation at low temperatures allows greater control of the membrane tensile and compressive stress, resulting in superior membranes.

A genuine need thus exists in the art for a membrane material which can be doped with boron and/or germanium in high concentrations.

DISCLOSURE OF INVENTION

It is thus an object of the invention to provide a membrane material comprising silicon doped with boron and/or germanium in high concentrations. It is a further object of the invention to provide an epitaxial silicon membrane comprising this membrane material.

It is also an object of the invention to provide a method for producing such an epitaxial silicon membrane, and a method of using the membrane material as a masking layer for selective etching of bulk silicon substrates or undoped silicon.

Briefly described, the present invention comprises a membrane material suitable for x-ray lithography. The material comprises silicon doped with boron and/or germanium. The boron is in a concentration range greater than $2 \times 10^{20}$ atoms of boron per cubic centimeter (cm$^3$) of silicon. The germanium is in a concentration range greater than $5 \times 10^{20}$ atoms of germanium per cubic centimeter of silicon.

A membrane can be made from one or more layers of this membrane material epitaxially deposited on a silicon substrate. Multiple layers form a laminate of epitaxially deposited silicon layers. In a laminate, each layer of epi silicon (epitaxially deposited silicon) is either doped or undoped. Each of the doped silicon layers may be doped with boron in the concentration range given above or doped with germanium in the concentration range given above, or doped with both boron and germanium in the concentration ranges given above.

The invention also provides a method of producing such epitaxial silicon membranes which comprises growing one or more films of silicon epitaxially using chemical vapor deposition at a temperature in a range of about 500°-850° C. on a substrate surface. The substrate is preferably silicon, but other substances with crystallographic properties similar to silicon can also be used. At least one of the films of silicon, as it is growing, is doped with the selected dopant and successive silicon film layers are produced one upon the other so as to produce a laminate of epitaxially deposited silicon films.

Preferably, the method of producing the epitaxial silicon membrane uses a substrate which has two surfaces. The films of silicon are epitaxially deposited on both surfaces of the substrate simultaneously.

Layers of the epitaxial silicon membranes doped with high concentrations of boron and/or germanium can be selectively etched in strongly alkaline anisotropic chemical etching solutions, e.g. KOH, NaOH, EPW. For example, a convenient and widely used etchant is potassium hydroxide (KOH) in the concentration range 20–30% at 60°–90° C., typically 25% at 80° C. Doped portions of silicon membranes (doped as indicated above with the given concentration ranges of boron and/or germanium) are resistant to etching with potassium hydroxide, whereas portions of silicon membranes not doped as disclosed in this application will be etched away by the potassium hydroxide.

More specifically, the invention involves a silicon membrane material, suitable for use in x-ray masks, and particularly its composition, structure, and fabrication process. The silicon material is grown epitaxially using UHV/CVD (ultra high vacuum chemical vapor deposition) or APCVD (atmospheric pressure chemical vapor deposition) at low temperature (from about 500° to 850° C.) and doped with boron in a concentration range greater than $2 \times 10^{20}$ atoms per cubic centimeter (e.g. 10 to 100 times greater than that of conventional high temperature epi silicon). It may also be doped with germanium in a concentration range greater than $5 \times 10^{20}$ atoms per cubic centimeter, or with other stress compensating dopants similar in effect to boron or germanium in inducing the desired stress compensation. For example, atoms such as antimony, gallium, and aluminum are larger than silicon atoms, like germanium, and produce compressive stress on the membrane. Atoms such as carbon are smaller than silicon atoms, like boron, and produce tensile stress on the membrane. The result is a stress compensation, defect free, transparent membrane.

These increased dopant ranges, made feasible by the low temperature process, offer greater control of the tensile and compressive stress and distortion of the membrane associated with these dopants. The membrane may be single layered or multi-layered and is grown on both surfaces of a substrate simultaneously to balance the stresses therefrom on the substrate, which balancing is important in the x-ray mask application. A simplified fabrication process for such masks involves depositing one or more variously doped silicon layers on the surfaces of the substrate to produce a laminated membrane structure made up of a stack of precisely formed, ultra thin, single crystal silicon films on each. The epi layer on one surface is selectively etched near the center and the substrate is then etched through the opening to the opposite surface by KOH etching or other suitable silicon etchants. No masking film is required to protect the membranes during the hot concentrated potassium hydroxide etching of the substrate as doped epi membrane material forms the exterior layers of the membrane and is resistant to the KOH. The surrounding substrate acts as a stress neutral support ring for the membrane, which acts in turn as a clear window for x-rays. The low temperature processing permits independent and accurate control of the bulk and surface properties of the membrane and minimizes interlayer impurity diffusion and the generation of defects. In addition to x-ray lithography mask applications, the membrane may be used as an etch stop in packaging and integrated circuit applications, as well as in micromechanical devices (such as transducers, actuators, and sensors) involving the use of diaphragms (e.g. pressure transducers, cantilevers, and microbridges).

BRIEF DESCRIPTION OF DRAWINGS

The foregoing and other objects, features and advantages of the invention will be apparent from the following more particular description of preferred embodiments of the invention as illustrated in the accompanying drawing.

BEST MODE FOR CARRYING OUT THE INVENTION

Figure 1A:
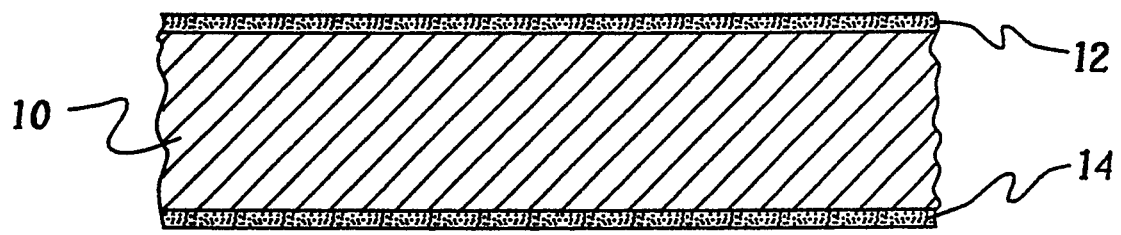
FIG. 1 illustrates the fabrication of epitaxial silicon membranes in accordance with the subject invention.
Figure 1B:
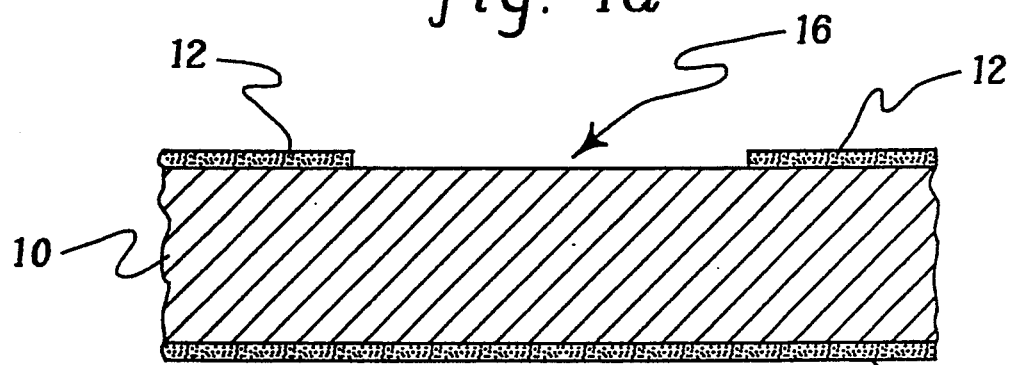
Figure 1C:
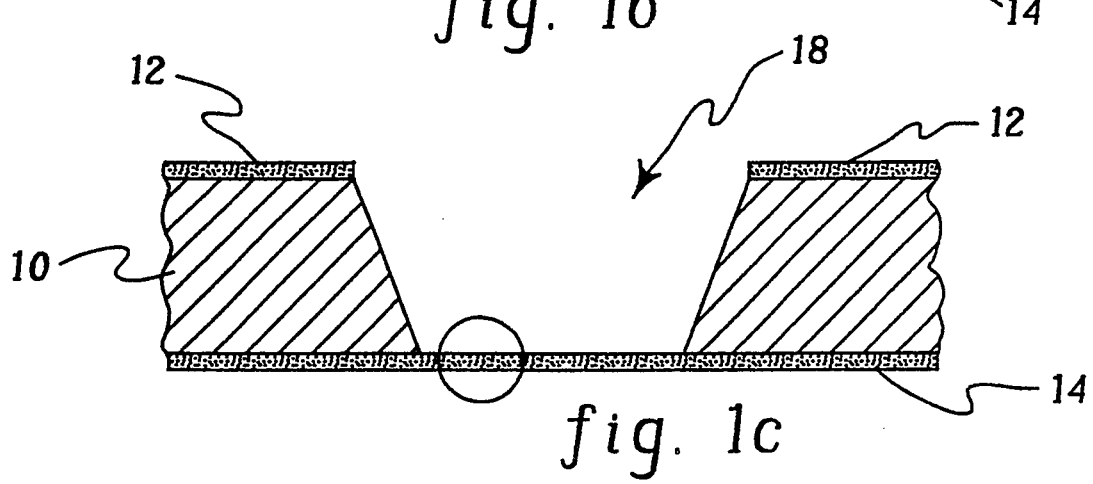

As used in the subject application, doping refers to the addition of impurities to a semiconductor material. Doping allows the manufacture of n-type and p-type semiconductors with varying degrees of conductivity. In general, the greater the extent of doping, the higher the conductivity.

An n-type material refers to a semiconductor material that has been doped with a donor-type impurity and, consequently, conducts a current via electrons. A p-type material refers to a semiconductor material that has been doped with an acceptor-type impurity and, consequently, conducts current via hole migration.

Mono-crystalline material refers to a substance, such as a semiconductor, of which a sample, regardless of size, consists of only one crystal, i.e. there are no grain boundaries (verses a number of separate crystals bound tightly together).

Epitaxial growth refers to growing mono-crystalline silicon on a silicon wafer by depositing silicon from a silicon-containing source (e.g. SiH$_4$, "silane" ) onto a wafer in a chamber in which temperature, atmosphere, flow and geometry are carefully controlled.

Epitaxy refers to the condition in which atoms in a thin film of single crystal material grown on the surface of the same material continue their characteristic alignment. Epitaxial silicon atoms are arranged in a perfect array and therefore exhibit an inherent symmetry in arrangement and orientation.

As mentioned previously, the broad concept of the subject invention is directed to silicon membrane materials suitable for use in x-ray lithography. The material is single crystal silicon that can be doped over an unusually large concentration range with boron and germanium. Boron and germanium are suitable dopants, as well as e.g. phosphorus and arsenic, due to their minimum effect on the crystal lattice structure of monocrystalline silicon and maximum effect on the electrical attributes of the doped silicon. When a dopant is added to mono-crystalline silicon, the dopant atoms occupy a space previously occupied by a silicon atom. This creates a perturbation which alters the electrical characteristics of the silicon. However, a perturbation can be created by doping which causes defects in the crystalline structure to occur. Such a defect includes cracking of the crystal, and is caused by the stresses resulting from doping. In the formation of doped silicon, it is thus very important to alleviate stress within the crystalline silicon while at the same time not creating defects in the crystalline structure. The crystalline structure must be maintained in order for epitaxial formation of membranes. The silicon membrane material is doped with boron in a concentration range greater than $2 \times 10^{20}$ atoms of boron per cubic centimeter of silicon, or with germanium in a concentration range greater than $5 \times 10^{20}$ atoms of germanium per cubic centimeter of silicon. The silicon membrane material may also be doped with a combination of boron and germanium in these concentration ranges. Even with these high dopant concentrations, the silicon material maintains is symmetry and purity, which is required for the formation of suitable membranes for x-ray lithography.

Preferably, the silicon membrane material is grown epitaxially at low temperature and doped with boron and/or germanium in the indicated concentration ranges. These ranges are much greater than those attainable with conventional high temperature epitaxial formation. This epitaxial deposition on semiconductor surfaces results in layer(s) of membrane material which can be used to form an epitaxial silicon membrane, as discussed below. Conventional high temperature (greater than 1,000° C.) membrane processes which employ diffusion, epitaxy, or ionic implantation methods are limited to $2-3 \times 10^{20}$ boron atoms per cubic centimeter. The extended range of dopant concentration allows greater control of the membrane tensile and compressive stress and eliminates or minimizes defects.

Figure 1D:
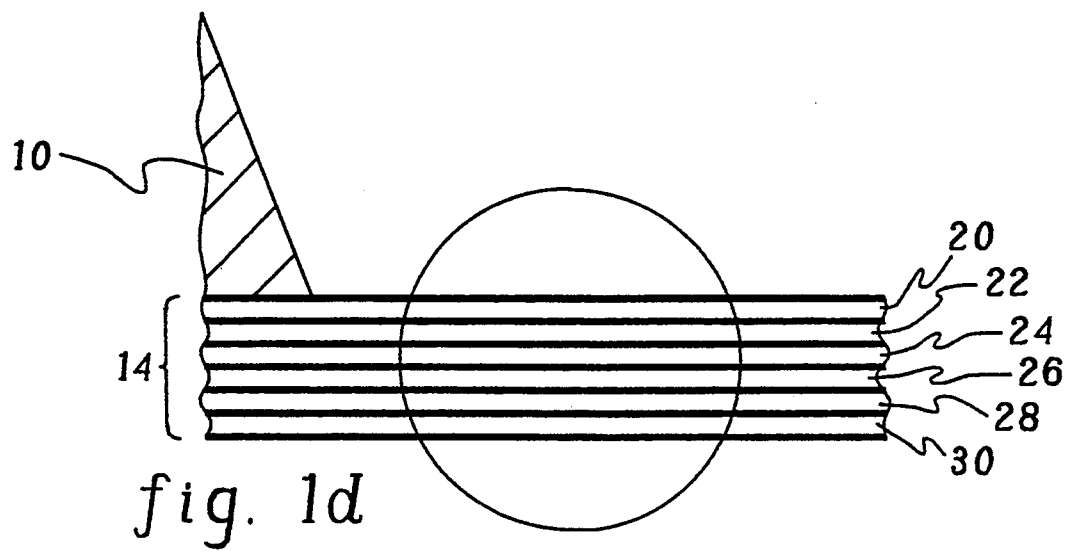

The epitaxial membrane can be single or multi-layered. With a multi-layered membrane, thin, discrete epitaxial films are deposited sequentially with precise control of individual film thickness and composition due to the low temperature of deposition, which minimizes inter-layer impurity and diffusion. By adjusting the thickness and dopant concentration of individual layers in a stacked structure (20, 22, 24, 26, 28 and 30 in FIG. 1d), it is possible to control independently and accurately the bulk and surface properties of the membrane, as well as to tailor the electrical characteristics of the membrane. Layers can be deposited that are only 3 or 4 atoms high, then a subsequent layer with a different dopant concentration can be deposited. This layer upon layer formation results in a superlattice having very interesting properties due to the interaction of the atoms in and between each successive layer. The size and proximity of the silicon atoms and dopant atoms result in the interaction. Such multi layer epitaxial structures cannot be produced by conventional processes. The low temperature of deposition also minimizes the generation defects (e.g. oxide precipitation) and distortion which are induced by high temperature processing.

Large area membranes 0.1 micrometers to 2.5 micrometers thick, heavily doped with boron and germanium, have been fabricated under a variety of epitaxial deposition conditions to form membranes under tension or compression. For x-ray mask applications, membranes 50 mm in diameter, 2 micrometers thick, defect free and under tension, were readily made by the simplified fabrication process as illustrated in FIG. 1.

The process is an epitaxial chemical vapor deposition (CVD) process which has unique capabilities and requires ultra high vacuum (UHV), and which is performed at unusually low temperature. The UHV/CVD method is exploited to tailor the membrane material properties and microstructure in a way which is very advantageous for x-ray mask applications. The invention also teaches how membranes can be made by a simplified etching process which requires no masking layers.

Specifically, referring to FIG. 1 there is illustrated a method of producing the epitaxial silicon membrane (center portion of 14) of the subject invention. The method comprises growing films (or layers) of silicon epitaxially using chemical vapor deposition at a low temperature in a range of about 500°–850° C. on a substrate surface. As shown in FIG. 1a, silicon layers 12 and 14 are deposited by epitaxial deposition onto a silicon wafer 10. Each of the silicon layers 12 and 14 may be single or multi-layered. FIG. 1d illustrates a multi-layered structure, including silicon layers 20, 22, 24, 26, 28 and 30. In the specific structure shown in FIG. 1, the layer 12 may be doped or undoped silicon. Lithography is used to etch 16 the epitaxially deposited layer 12 of silicon. The layer 14 at this point has not yet been etched. After layer 12 is etched, the resulting structure is etched using KOH. The KOH etches 18 through the bulk silicon 10 to the interface between the epitaxial silicon layer 20 and the bulk silicon 10. Layer 20 must be highly doped in order to prevent the KOH from etching through layers 14. Since the entire structure is immersed in KOH, layer 30 must also be highly doped in order to prevent the KOH from etching through layers 14 from the opposite direction. If the layer 14 is single layered, the entire layer must be highly doped. In the structure shown in FIG. 1d, layers 22, 24, 26 and 28 may be doped with any concentration of dopant or undoped, since the highly doped layers 20 and 30 protect these internal layers from the KOH etchant. After the KOH etch is complete, the resulting structure represents an epitaxially grown silicon membrane (center of 14) supported by the bulk silicon 10. The silicon membrane is thin enough (e.g. approximately 100 nanometers) to be transparent to x-rays and can therefore be used in the fabrication of x-ray masks.

As shown in FIG. 1, the substrate 10 upon which the silicon film is deposited preferably has two surfaces, and the epitaxial deposition occurs on both surfaces simultaneously. This is important in order to better adjust the stress on the substrate and to provide a highly doped outer layer to simplify mask fabrication. This offers an important advantage which permits symmetrical tensile stresses on the wafer. Such a laminated membrane structure is similar to a superlattice and cannot be made at high temperature because of out diffusion or smearing of the dopant throughout the laminate. The latitude provided by layering and dopant concentration range allows far better adjustment of stress in the membrane.

The doped silicon membrane material can also be used to control the composition of discrete layers in a stacked multi-layer epitaxial membrane because the concentration of dopant acts as an etch stop when the membrane is etched using potassium hydroxide. Therefore, no masking is required during substrate etching due to this etch-stop produced by the high doping of the membrane surfaces (as shown in FIG. 1). Control of the composition of discrete layers in the stacked multi-layer epitaxial membrane is a unique attribute of low temperature epitaxial deposition processes.

Specifically, doped epi layers are virtually unetchable in hot concentrated potassium hydroxide (KOH) solutions if the boron dopant concentration is greater than or equal to $5 \times 10^{20}$ per cubic centimeter. A layer as thin as approximately 10 nanometers is sufficient to function as an etch stop in hot concentrated KOH solutions. By using such highly doped epi layers as the external layers of a multi-layer epi membrane (or as the single layer of a single layer membrane), no masking film or coating is required to protect the epitaxial silicon membrane and therefore the fabrication process is considerably simplified (see FIG. 1). Normally, a film of silicon dioxide or silicon nitride is required to protect boron doped silicon membranes during the etching process.

The superiority of the epitaxial UHV/CVD silicon membranes so made, compared to presently available silicon membranes, results from the following:

1. Defects in the membranes, particularly slip lines, can be totally eliminated, leading to greater reliability and increased optical transparency.
2. Adjustment can be made in the mechanical stress of the membrane via composition and lamination, leading to better control of membrane distortion and strength.
3. Low temperature used in making membranes minimizes warp and distortion.
4. A simplified membrane etching procedure through elimination of a masking film reduces manufacturing cost.

In one preferred embodiment of the subject invention, the epitaxial layers are formed using the following UHV-CVD conditions:

GASES: 1% $B_2H_6$ (diborane) in $SiH_4$ (silane) as source; 0.5% $GeH_4$ (germane)
PRESSURE: 0,001 Torr
DEPOSITION RATE: about 5-10 Angstroms/minute
TEMPERATURE: 500° C.
WAFERS WITHIN CHAMBER: 35

A thorough discussion of low temperature epitaxial deposition of silicon can be found in B. S. Meyerson et al., "Non-equilibrium Boron Doping Effects in Low Temperature Epitaxial Si", Applied Physics Letter, Vol. 50, p. 119 (1987) and B. S. Meyerson et al., "Cooperative Growth Phenomena in Si:Ge Low Temperature Epitaxy", Applied Physics Letter, Vol. 53, p. 2555 (1988), the contents of each of which are hereby incorporated in their entireties.

While the invention has been particularly shown and described with reference to preferred embodiments thereof, it will be understood by those skilled in the art that various changes in form and details may be made therein without departing from the spirit and scope of the invention.

We claim:

1. A method of producing an epitaxial silicon membrane, said method comprising the steps of:

growing one or more films of silicon epitaxially using chemical vapor deposition at a temperature in a range of about 500° to about 850° C. on a substrate surface; and doping at least one of said silicon films during said growing with a dopant selected from the group consisting of: boron in a concentration range greater than $2 \times 10^{20}$ atoms of boron/$cm^3$ of silicon; germanium in a concentration range greater than $5 \times 10^{20}$ atoms of germanium/$cm^3$ of silicon; and boron and germanium, said boron in a concentration range greater than $2 \times 10^{20}$ atoms of boron/$cm^3$ of silicon and said germanium in a concentration range greater than $5 \times 10^{20}$ atoms of germanium/$cm^3$ of silicon.

2. The method of claim 1 wherein said substrate has two surfaces and said growing step comprises growing said films of silicon on both of said surfaces simultaneously.

3. The method of claim 1 wherein said substrate comprises silicon.

4. A method of selectively etching an epitaxial silicon membrane, said method comprising the steps of:

doping portions of said silicon membrane with a dopant selected from the group consisting of: boron in a concentration range greater than $2 \times 10^{20}$ atoms of boron/$cm^3$ of silicon; germanium in a concentration range greater than $5 \times 10^{20}$ atoms of germanium/$cm^3$ of silicon; and boron and germanium, said boron in a concentration range greater than $2 \times 10^{20}$ atoms of boron/$cm^3$ of silicon and said germanium in a concentration range greater than $5 \times 10^{20}$ atoms of germanium/$cm^3$ of silicon, other portions of said silicon membrane not being so doped; and etching the resulting silicon membrane with a strongly alkaline anisotropic chemical etching solution so as to selectively remove said other portions of said silicon membrane.

5. The method of claim 4 wherein said strongly alkaline anisotropic chemical etching solution comprises potassium hydroxide.

* * * * *